(12) United States Patent

Chang et al.

(10) Patent No.: US 12,609,527 B2

(45) Date of Patent: *Apr. 21, 2026

(54) ELECTROSTATIC DISCHARGE PROTECTION CIRCUIT USING GaN-BASED DEVICES

(71) Applicant: UNITED MICROELECTRONICS CORP., Hsin-Chu City (TW)

(72) Inventors: Yu-Hsuan Chang, New Taipei City (TW); Ching-Wei Li, Hsinchu City (TW); Jih-San Lee, Hsinchu City (TW); Tien-Hao Tang, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 157 days.

This patent is subject to a terminal disclaimer.

(21) Appl. No.: 18/657,759

(22) Filed: May 7, 2024

(65) Prior Publication Data

US 2025/0323497 A1 Oct. 16, 2025

(30) Foreign Application Priority Data

Apr. 10, 2024 (TW) .................................. 113113224

(51) Int. Cl.
| | |
|---|---|
| *H02H 9/04* | (2006.01) |
| *H03K 17/08* | (2006.01) |
| *H10D 89/60* | (2025.01) |

(52) U.S. Cl.
CPC ............. *H02H 9/046* (2013.01); *H03K 17/08* (2013.01); *H10D 89/60* (2025.01)

(58) Field of Classification Search
CPC ......... H02H 9/046; H03K 17/08; H10D 89/60
USPC .......................................................... 361/56
See application file for complete search history.

(56) References Cited

U.S. PATENT DOCUMENTS

| | | | |
|---|---|---|---|
| 6,690,555 B1 * | 2/2004 | Pasqualini ........... | H10D 89/811 |
| | | | 361/91.1 |
| 8,879,220 B2 | 11/2014 | Lin | |
| 10,978,445 B2 | 4/2021 | Lai | |
| 2013/0265676 A1 * | 10/2013 | Prabhu ................... | H02H 9/046 |
| | | | 361/56 |
| 2015/0229125 A1 * | 8/2015 | Kato ...................... | H02H 9/046 |
| | | | 361/56 |
| 2018/0026029 A1 * | 1/2018 | Lin .......................... | H10D 1/47 |
| | | | 361/56 |
| 2019/0237456 A1 * | 8/2019 | Lai .......................... | H10D 84/01 |

(Continued)

*Primary Examiner* — Dharti H Patel

(74) *Attorney, Agent, or Firm* — Winston Hsu

(57) ABSTRACT

An ESD protection circuit using GaN devices, with a ESD protection block including a first 2DEG resistor with one terminal coupled to a reference voltage, a first trigger with one terminal coupled to the another terminal of the first 2DEG resistor and with another terminal coupled to a gate of a power HEMT, a first LV-HEMT with a first gate coupled to the another terminal of the first 2DEG resistor and a first drain couple to the gate, a second 2DEG resistor with one terminal coupled to the gate, a second trigger with one terminal coupled to another terminal of the second 2DEG resistor and with another terminal coupled to the reference voltage, and a second LV-HEMT with a second gate coupled to the another terminal of the second trigger and a second drain coupled to the first source and a second source coupled to the reference voltage.

14 Claims, 7 Drawing Sheets

(56)  References Cited

U.S. PATENT DOCUMENTS

| | | | | |
|---|---|---|---|---|
| 2020/0365581 A1* | 11/2020 | Guan | ................... | H02H 9/046 |
| 2021/0249404 A1* | 8/2021 | Lai | ..................... | H10D 84/811 |
| 2022/0376494 A1* | 11/2022 | Guan | ................. | H10D 89/811 |
| 2023/0198252 A1* | 6/2023 | Mizan | ................. | H10D 89/60 |
| | | | | 361/56 |
| 2024/0234411 A1* | 7/2024 | Lai | ..................... | H10D 89/811 |
| 2025/0311441 A1* | 10/2025 | Chang | ............... | H10D 84/811 |

\* cited by examiner

ELECTROSTATIC DISCHARGE PROTECTION CIRCUIT USING GaN-BASED DEVICES

BACKGROUND OF THE INVENTION

1. Field of the Invention

The present invention relates generally to an electrostatic discharge (ESD) protection circuit, and more specifically, to an ESD protection circuit using GaN devices.

2. Description of the Prior Art

Most of semiconductor devices currently available in the world are silicon-based semiconductor using silicon as their basic materials and channel. However, in the application of high-voltage or high-power devices, silicon-based devices may suffer high power consumption since their on-state resistance is too large. Furthermore, in high-frequency operation, silicon-based device has relatively lower switch frequency, thus its performance is no match for wide band gap compound semiconductor material like gallium nitride (GaN) or silicon carbide (Sic). In comparison to conventional silicon-based material, wide band gap compound semiconductor material like GaN is provided with larger band gap and lower on-state resistance, thus it is more durable and applicable in high temperature, high voltage, high frequency and high current applications, and also has better energy conversion efficiency. Thus, GaN device is provided with all kinds of excellent properties required in semiconductor device, like good heat dissipation, small size, lower power consumption and high power, which is suitable for the application of power semiconductor devices. With the urgent demand in high-end industry like 5G communication and electric car, GaN material emerges to be a promising candidate of the third generation semiconductor materials in the future.

Nevertheless, GaN device is usually provided with smaller gate-to-source breakdown voltage (ex. less than 10V), and this makes the gate of GaN device susceptible to gate voltage overshoot and causes damage. Electrostatic discharge (ESD) is one type of voltage overshoot, resulting from sudden release of electrostatic charges, inducing high intense electric field and current in ICs, thereby damaging the GaN devices in the circuit, especially the power GaN device that bears the brunt of the ESD. Accordingly, those of skilled in the art needs to design and develop a kind of circuit and structure capable of protecting GaN devices, especially against the weakness of smaller gate-to-source breakdown voltage, in hope of providing better application of GaN devices.

SUMMARY OF THE INVENTION

In the light of the aforementioned weakness of GaN device susceptible to the damage of voltage overshoot, the present invention hereby provides a novel ESD protection circuit, with feature that components in the ESD protection circuit may all be GaN-based devices, including resistor, capacitor, diode or high electron mobility transistor (HEMT), so that those devices may be made on the same GaN substrate and integrated in the same process.

The objective of the present invention is to provide an ESD protection circuit using GaN devices, with structure including a power HEMT having a gate, a source and a drain, the source and drain are coupled respectively to a first reference voltage and a second reference voltage. An ESD block includes a first sub-block, the first sub-block includes: a first 2DEG resistor with one terminal coupled to the first reference voltage, a first trigger with one terminal coupled to another terminal of the first 2DEG resistor and with another terminal coupled to the gate, and a first LV-HEMT has a first gate, a first source and a first drain, the first gate is coupled to the another terminal of the first 2DEG resistor and the terminal of the first trigger, and the first drain is coupled to the gate. The ESD protection further includes a second sub-block. The second sub-block includes a second 2DEG resistor with one terminal coupled to the gate, and a second trigger with one terminal coupled to another terminal of the second 2DEG resistor and with another terminal coupled to the first reference voltage; and a second LV-HEMT with a second gate, a second source and a second drain, the second gate is coupled to the terminal of the second trigger and the another terminal of the second 2DEG resistor, the second drain is coupled to the first source of the first LV-HEMT, and the second source is coupled to the first reference voltage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
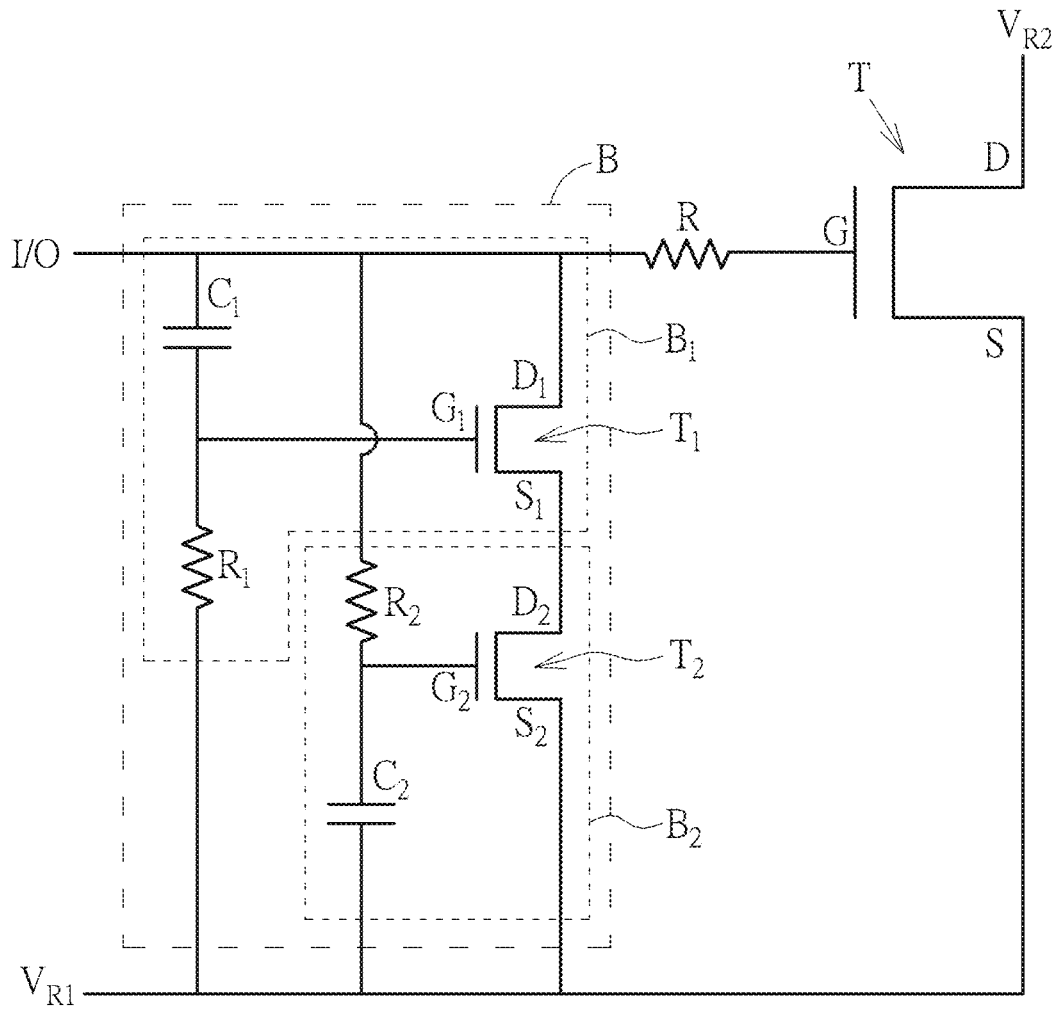
FIG. 1 is a schematic diagram of an ESD protection circuit using GaN-based devices in accordance with one embodiment of the present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned, and the materials added on top of the substrate can be patterned or remain unpatterned. The substrate in the specification is specified as GaN-based substrate, with semiconductor device manufactured thereon being specified generally as GaN-based device.

As used herein, the term "layer" refers to a material portion including a region with thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The subject of present invention is to provide an electrostatic discharge (ESD) protection circuit based on GaN-based devices. In comparison to conventional Si-based MOSFET, GaN-based high electron mobility transistor (HEMT) has lower threshold voltage and smaller gate-to-source on-state resistance. In one aspect, these properties render the HEMT with lower necessary gate driving force and higher current and switching frequency. In another aspect, lower gate breakdown voltage of HEMT may also induce the damage of gate terminal, since voltage surge of gate overshoot may easily exceed the gate breakdown voltage. Accordingly, in actual implementation, gate protection circuit is usually adopted in industry to protect GaN-based HEMTs in order to avoid device damage caused by the generated voltage surge during device switching or electrostatic discharging. In the embodiment of present invention, the referred HEMT devices are all considered as enhancement mode E-HEMTs with normally-off property, unless otherwise stated.

First, please refer to FIG. 1, which is a schematic diagram of an ESD protection circuit using GaN-based devices in accordance with one embodiment of the present invention, illustrating various GaN-based devices that constitute the ESD protection circuit of the present invention. As shown in FIG. 1, the ESD protection circuit of present invention includes a power E-HEMT T, which may be used to amplify power in amplifying circuit, suitable in the field of radio frequency, microwave or mmWave, etc. Since the power E-HEMT T is GaN-based transistor, its gate terminal is susceptible to the damage due to the surge of voltage overshoot. As shown in FIG. 1, the power E-HEMT T includes a gate G, a source S and a drain D, wherein the source S and drain D are coupled respectively to a first reference voltage $V_{R1}$ (ex. ground voltage $V_{SS}$) and a second reference voltage $V_{R2}$ (ex. operating voltage $V_{DD}$). In order to protect the gate G of power E-HEMT T, an ESD protection block B is designed in the circuit to couple between the gate G and source S of the power E-HEMT T to provide ESD protection function. In normal operating voltage condition, ESD block B is inactive and the power E-HEMT T operates in normal mode. However, voltage overshoot may be generated during device switching or ESD, the ESD protection block B is designedly active at this time to protect power E-HEMT T from the impact of voltage surge and avoid gate damage. In the embodiment, the gate G of power E-HEMT T may be coupled directly to an input/output terminal I/O of a IC chip through the ESD block B, and a resistor R (ex. a two-dimensional electron gas (2DEG) resistor, referred hereinafter as a main resistor) may be set designedly between the ESD block B and gate G to further lower the voltage applied on the gate G. One or more other circuit may be further set between the ESD block B and I/O terminal, but not limited thereto.

Refer still to FIG. 1. The ESD block B is divided into a first sub-block $B_1$ and a second sub-block $B_2$ with different trigger voltages respectively. In the embodiment of present invention, the first sub-block $B_1$ and second sub-block $B_2$ are both coupled between the gate G and source S of the power E-HEMT T, but in inverted configuration. More specifically, the first sub-block $B_1$ is composed of a first 2DEG resistor $R_1$, a first capacitor $C_1$ and a first low-voltage HEMT (LV-HEMT) $T_1$, wherein the first 2DEG resistor $R_1$ functions as a voltage divider, with one terminal coupled to the first reference voltage $V_{R1}$ and the source S of the power HEMT T. The first capacitor $C_1$ functions as one of triggers in ESD protection circuit, with one terminal coupled to another terminal of the first 2DEG resistor $R_1$ and with another terminal coupled to the gate of power HEMT T (may pass through main resistor R) and the I/O terminal. The first LV-HEMT $T_1$ is designedly as a switching device in discharging path, with a specific threshold voltage. The first LV-HEMT $T_1$ further includes a first gate $G_1$, a first source $S_1$ and a first drain $D_1$, wherein the first gate $G_1$ is coupled to the another terminal of first 2DEG resistor $R_1$ and the terminal of first capacitor $C_1$, and the first drain $D_1$ is coupled to the gate G of power HEMT T (may pass through main resistor R) and the I/O terminal. In operation, when the voltage of first source $S_1$ or first drain $D_1$ is greater than the voltage of first gate $G_1$ and the voltage difference therebetween exceeds the threshold voltage of first LV-HEMT $T_1$, the first LV-HEMT $T_1$ is conducted.

Refer still to FIG. 1. The structure of second sub-block $B_2$ is similar to the one of first sub-block $B_1$, but in an inverted circuit configuration. As shown in FIG. 1, the second sub-block $B_2$ is composed of one second 2DEG resistor $R_2$, one second capacitor $C_2$ and one second LV-HEMT $T_2$, wherein the second 2DEG resistor $R_2$ functions as a voltage divider, with one terminal coupled to the gate G of power HEMT T (may pass through main resistor R) and the I/O terminal. The second capacitor $C_2$ functions as another trigger in the ESD protection circuit, with one terminal coupled to another terminal of the second 2DEG resistor $R_2$ and with another terminal coupled to the source S of power HEMT T and the first reference voltage $V_{R1}$. The second LV-HEMT $T_2$ is designedly as a switching device in discharging path, which is provided with a specific threshold voltage. The second LV-HEMT $T_2$ further includes a second gate $G_2$, a second source $S_2$ and a second drain $D_2$, wherein the second gate $G_2$ is coupled to the another terminal of second 2DEG resistor $R_2$ and the terminal of the second capacitor $C_2$, the second drain $D_2$ is coupled to the first source $S_1$ of first LV-HEMT $T_1$, and the second source $S_2$ is coupled to the source S of power HEMT T and the first reference voltage $V_{R1}$. In operation, when the voltage of second source $S_2$ or second drain $D_2$ is greater than the voltage of second gate $G_2$ and the voltage difference therebetween exceeds the threshold voltage of second LV-HEMT $T_2$, the second LV-HEMT $T_2$ is conducted.

In actual operation, when the positive voltage surge resulted from ESD enters the chip from I/O terminal, the voltage of another terminal of first capacitor $C_1$ and second gate $G_2$ of the second LV-HEMT $T_2$ will be asserted upward to an active level. Since the threshold voltage of second LV-HEMT $T_2$ is designedly less than the threshold of first capacitor $C_1$, the ESD surge will firstly turn on the second LV-HEMT $T_2$. However, the mere turning-on of second LV-HEMT $T_2$ does not result in a complete conduction path from the I/O terminal to first reference voltage $V_{R1}$, thus no current passes through the second LV-HEMT $T_2$ at this moment. The first capacitor $C_1$ also remains un-conducted until the voltage of the another terminal of first capacitor $C_1$ is asserted upward to the active level and with the voltage difference therebetween exceeding the threshold voltage of first capacitor $C_1$, then the first capacitor $C_1$ is conducted.

Furthermore, after the first capacitor $C_1$ is conducted, a first conduction path from the I/O terminal to first reference voltage $V_{R1}$ through the first capacitor $C_1$ and the first 2DEG resistor $R_1$ is formed. Since the first 2DEG resistor $R_1$ has larger resistance designedly, the current passing through the first conduction path would be smaller. With the voltage asserting of first capacitor $C_1$, the voltage of the terminal of first capacitor $C_1$ is also increased, until the voltage difference of the first gate $G_1$ of first LV-HEMT $T_1$ exceeds the threshold voltage of first LV-HEMT $T_1$, then the first LV-HEMT $T_1$ is conducted.

Following previous operation, since the second LV-HEMT $T_2$ is already conducted before, a second conduction path from the I/O terminal to the first reference voltage $V_{R1}$ through the first LV-HEMT $T_1$ and second LV-HEMT $T_2$ is formed when the first LV-HEMT $T_1$ is conducted. In the embodiment of present invention, the first LV-HEMT $T_1$ and second LV-HEMT $T_2$ are designedly robust, for example having larger area and able to withstand larger current, thus the second conduction path is in fact a channel for releasing ESD surge. That is the mechanism of ESD protection in the present invention.

Conversely, when a negative voltage surge enters the chip from the I/O terminal, its protection mechanism would be completely opposite to the aforementioned mechanism, with the first LV-HEMT $T_1$ asserted upward firstly and conducted, then the second capacitor $C_2$ conducted, and the second LV-HEMT $T_2$ is active and conducted lastly, so as to establish a second conduction path for releasing ESD surge.

Figure 2:
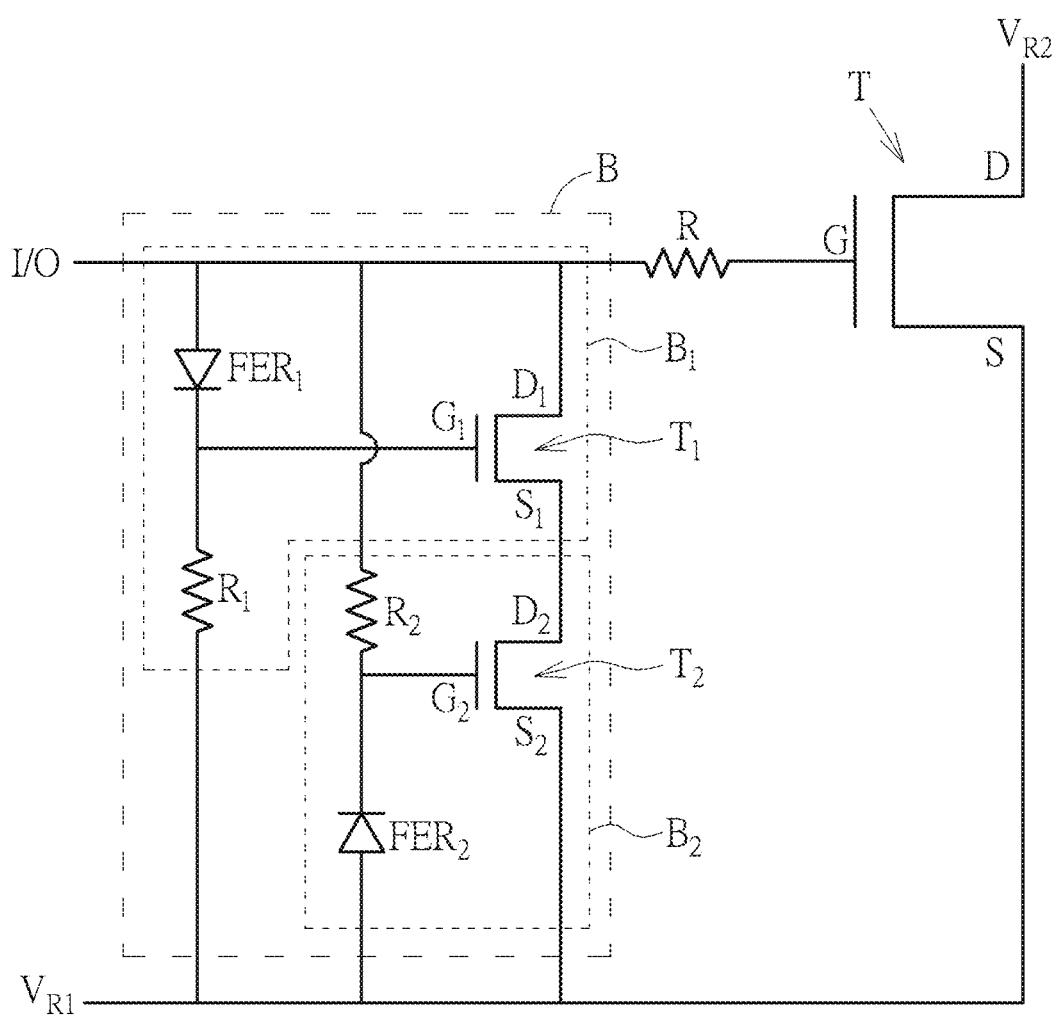
FIG. 2 is a schematic diagram of an ESD protection circuit using GaN-based devices in accordance with another embodiment of the present invention.

Please refer now to FIG. 2, which is a schematic diagram of an ESD protection circuit using GaN-based devices in accordance with another embodiment of the present invention. The circuit components in this embodiment is much the same as the embodiment of FIG. 1, with the difference only that the two triggers in this embodiment are changed from capacitors $C_1/C_2$ to lateral field effect rectifiers $FER_1/FER_2$. In this embodiment, one trigger may include one or more lateral field effect rectifiers in serial connection (represented by only one symbol in the figure). The lateral field effect rectifiers $FER_1/FER_2$ may achieve the same purpose as the capacitors $C_1/C_2$ in the protection circuit of present invention, and its operating mechanism is the same as aforementioned embodiment, thus redundant description will be herein omitted.

After the circuit structure of ESD protection circuit of the present invention is explained, following figures and embodiments will describe various GaN-based devices used in the circuit in cross-sectional view. One essential feature of the present invention lies that the components in the circuit may all be GaN-based devices, which may be made on the same GaN substrate and integrated in the same process.

Figure 3:
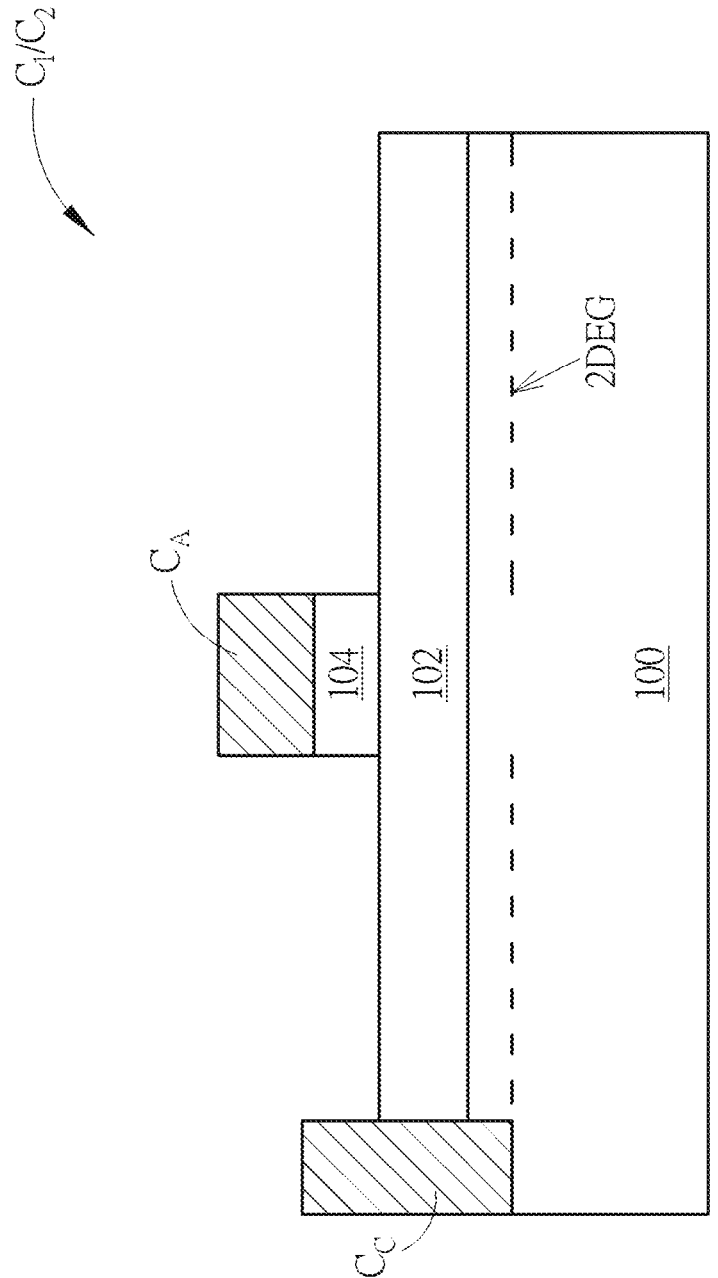
FIG. 3 is a schematic cross-section of a GaN-based capacitor in accordance with one embodiment of the present invention.

Please refer first to FIG. 3, which is a schematic cross-section of a capacitor in accordance with one embodiment of the present invention, illustrating detailed structure of the first capacitor $C_1$ or second capacitor $C_2$ in FIG. 1. As shown in FIG. 3, the capacitors $C_1/C_2$ of present invention may be GaN-based capacitors, which set on a GaN substrate 100. Alternatively, the GaN substrate 100 may be a GaN epitaxial layer formed on conventional silicon substrate, with layer structure like buffer layers and superlattice layers formed therebetween, but not limited thereto. Following figures will use only one GaN substrate 100 as a representative. In the embodiment, an aluminum gallium nitride (AlGaN) layer 102 is formed on the GaN substrate 100, and a heterojunction having band gap discontinuity is formed between the AlGaN layer 102 and the GaN substrate 100, thus electrons generated from piezoelectric effect in the AlGaN layer 102 will be trapped into the GaN substrate 100, thereby forming a high mobile and conductive electron film adjacent to the interface of two layer structures, i.e. 2DEG, which may function as a channel for transistor devices. Furthermore, since enhancement mode GaN device with normally-off property is preferred in the present invention, a patterned p-type GaN layer 104 (p-GaN, for example using GaN doped with elements like C, Fe, Mg or Zn) is further formed on the AlGaN layer 102 to deplete the 2DEG right thereunder to form non-conductive depletion region.

Refer still to FIG. 3. In addition to the conductive region and non-conductive region formed by the GaN material, the first capacitor $C_1$ or second capacitor $C_2$ further include an anode $C_A$ formed on the p-GaN layer 104 and a cathode $C_C$ formed on the GaN substrate 100 and AlGaN layer 102 at one side of the p-GaN layer 104 to function as two electrodes of the capacitor. The material of anode $C_A$ and cathode $C_C$ may include refractory metal or conductive layer of relevant compound, like Ti, TiN, TiW and W, or may include Ni, Au, Cu or the alloy thereof. In the embodiment of present invention, the anode $C_A$ and cathode $C_C$ are conductive terminals at two ends of the GaN capacitor, while the non-conductive region therebetween is capacitive dielectric layer, ex. AlGaN layer 102 and p-GaN layer 104. When there is voltage applied between the two conductors insulated by the non-conductive region, electric field will be formed on the non-conductive region, so as to make positive charges concentrating on one conductor and negative charges concentrating on another conductor. For example, take the second capacitor $C_2$ as an example, when positive voltage surge enters the chip from I/O terminal, the cathode $C_C$ is equivalent to the another terminal that is coupled with the I/O terminal, while anode $C_A$ is equivalent to the terminal that is coupled with the first reference voltage $V_{R1}$. The first capacitor $C_1$ is in inverted configuration in the condition of negative voltage surge. In other embodiment, the positions of cathode $C_C$ and anode $C_A$ may be interchanged, but not limited thereto. The capacitance produced by this GaN-based capacitor is preferably between 1 pF-50 pF.

Figure 4:
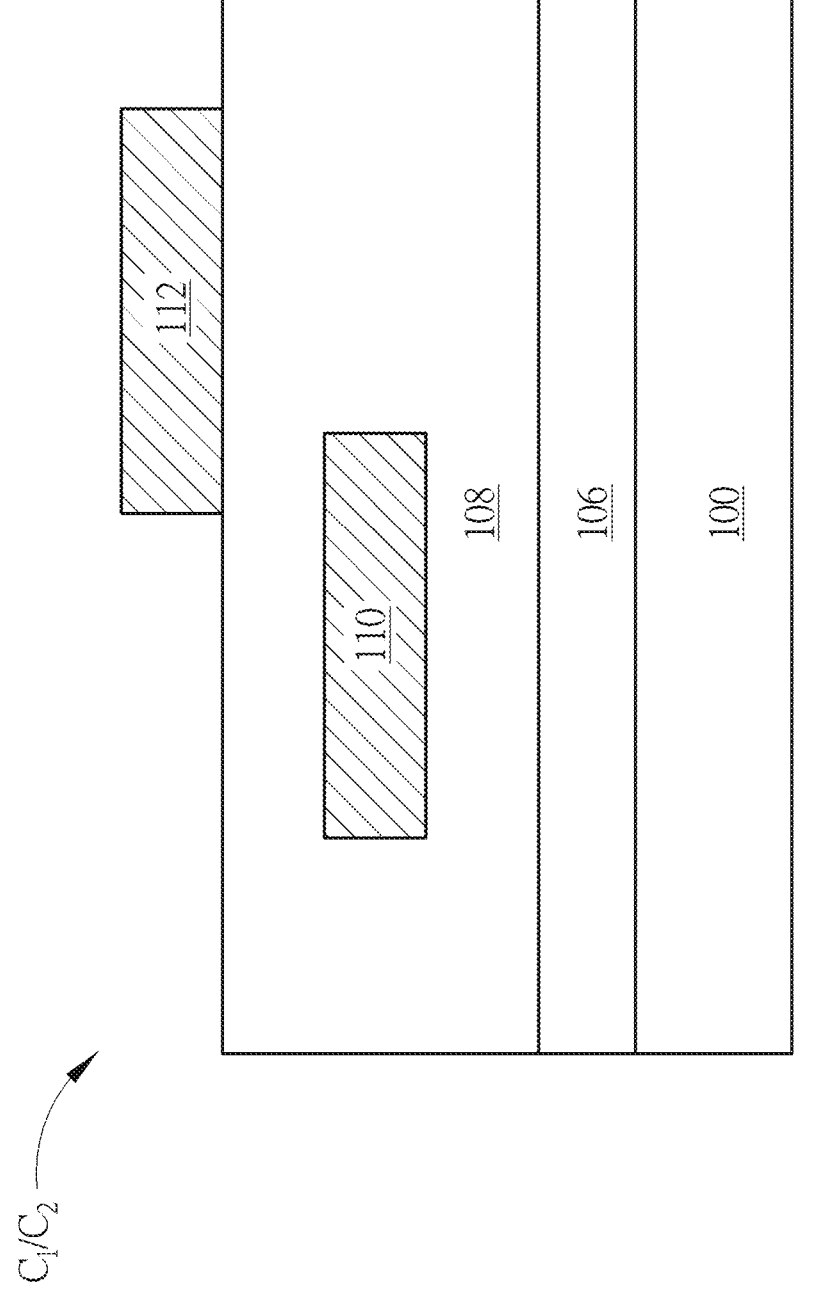
FIG. 4 is a schematic cross-section of a MIM capacitor in accordance with one embodiment of the present invention.

Please refer now to FIG. 4, which is a schematic cross-section of a capacitor in accordance with another embodiment of the present invention. In addition to the aforementioned GaN-based capacitor, the first capacitor $C_1$ or second capacitor $C_2$ of present invention may also be common metal-insulator-metal (MIM) capacitor. As shown in FIG. 4, similarly, the first capacitor $C_1$ or second capacitor $C_2$ is manufactured on the GaN substrate 100. Different from the previous embodiment that AlGaN layer 102 is formed to generate 2DEG, instead, an ion implant isolation layer 106 is formed on the GaN substrate 100, for example by heavily doping the surface of GaN substrate 100 to form a non-conductive layer, in order to avoid electrical coupling between the GaN substrate and the conductive layer formed thereon. A passivation layer 108 is formed on the ion implant isolation layer 106, with material like one or more layer of $SiO_2$, SiN, SiON, USG (undoped silicate glass) or PSG (phosphosilicate glass). In the embodiment, an anode metal layer 110 and a cathode metal layer 112 may be formed respectively in or on the passivation layer 108 to function as two electrodes of the capacitor. The material of anode metal layer 110 and cathode metal layer 112 may include refractory metal or conductive layer of relevant compound, like Ti, TiN, TiW and W, or may include Ni, Au, Cu or the alloy thereof. The passivation layer 108, anode metal layer 110 and cathode metal layer 112 may be integrally formed in semiconductor BEOL (back-end-of-line) process. Similarly, in the embodiment of present invention, the anode metal layer 110 and cathode metal layer 112 are the conductors at two terminals of the MIM capacitor, while the passivation layer 108 therebetween is capacitive dielectric layer. When there is voltage applied between the anode metal layer 110 and the cathode metal layer 112, electric field will be formed in the passivation layer 108, so as to make positive charges concentrating on one conductor and negative charges concentrating on another conductor. For example, take the first capacitor $C_1$ as an example, when positive voltage surge enters the chip from I/O terminal, the cathode metal layer 112 is equivalent to the another terminal that is coupled with the I/O terminal, while the anode metal layer 110 is equivalent to the terminal that is coupled with the first reference voltage $V_{R1}$. The second capacitor $C_2$ is in inverted configuration in the condition of negative voltage surge. In other embodiment, the positions of anode metal layer 110 and cathode metal layer 112 may be interchanged, but not limited thereto. The capacitance produced by this MIM capacitor is preferably between 1 pF-50 pF.

Figure 5:
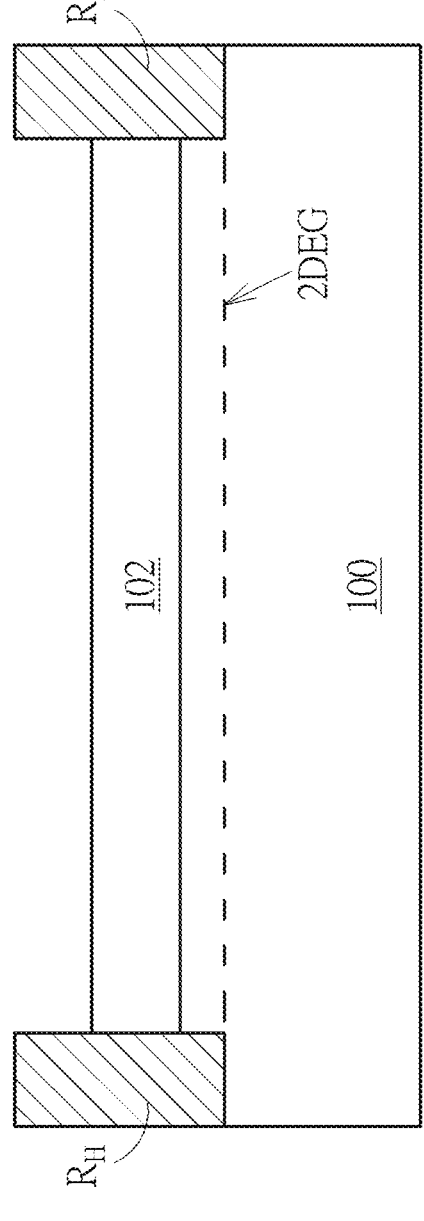
FIG. 5 is a schematic cross-section of a GaN-based resistor in accordance with one embodiment of the present invention.

Please refer now to FIG. 5, which is a schematic cross-section of a GaN-based resistor in accordance with one embodiment of the present invention, illustrating detailed structures of the main resistor R, first 2DEG resistor $R_1$ and/or second 2DEG resistor $R_2$ in FIG. 1. As shown in FIG. 5, likewise, the resistors $R/R_1/R_2$ of present invention are set on GaN substrate 100. An AlGaN layer 102 is formed on the GaN substrate 100, so as to form a 2DEG as conductive channel. Different from the previous embodiments, there is no pattern of p-GaN layer 104 formed on the AlGaN layer 102 to produce non-conductive depletion region. In other word, the entire 2DEG is the main body of resistor. A high-voltage terminal $R_H$ and a low-voltage terminal $R_L$ are formed on the AlGaN layer 102 and GaN substrate 100 respectively at two terminals of the resistor $R/R_1/R_2$. Take the second 2DEG resistor $R_2$ as an example, the high-voltage terminal $R_H$ is the terminal coupled with the I/O terminal and the gate G of power HEMT T (may pass through the main resistor R), while the low-voltage terminal $R_L$ is the another terminal coupled with the second capacitor $C_2$. The resistance produced by this GaN-based resistor is preferably between 50Ω-100 kΩ.

Figure 6:
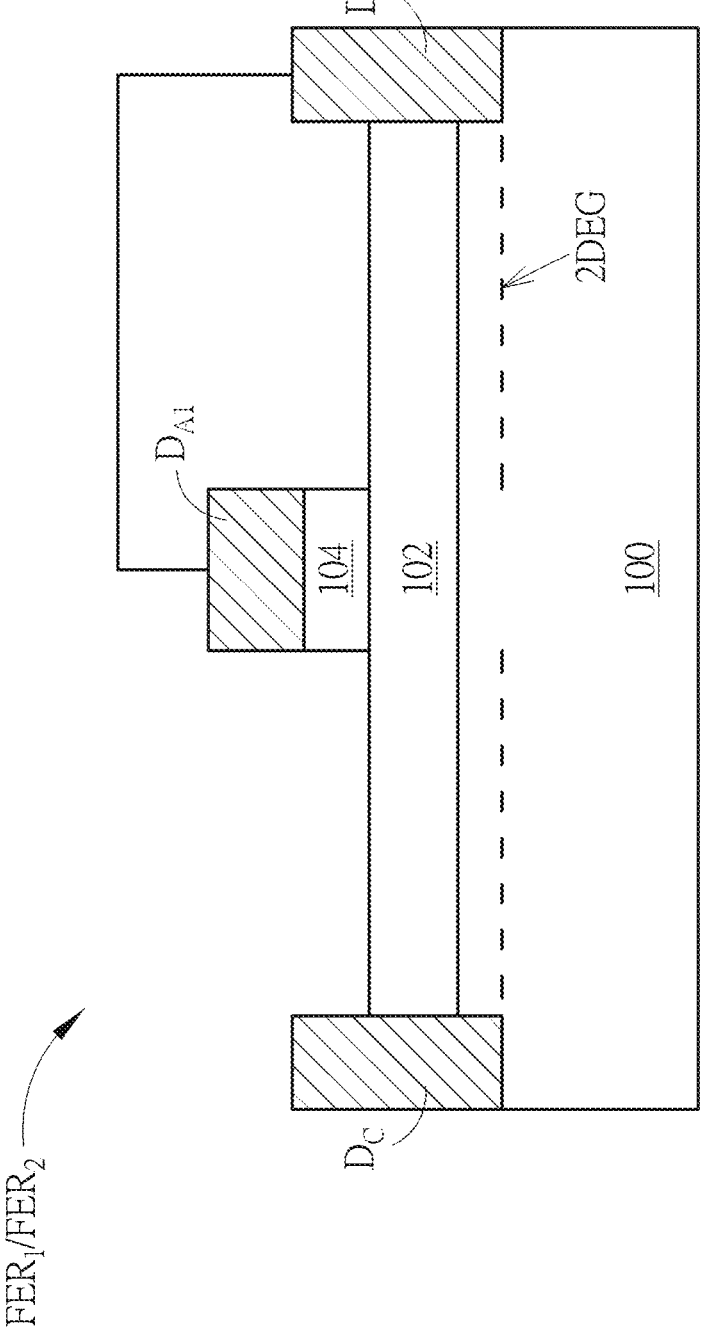
FIG. 6 is a schematic cross-section of a GaN-based lateral field effect rectifier (LFER) in accordance with one embodiment of the present invention.

Please refer now to FIG. 6, which is a schematic cross-section of a lateral field effect rectifier functioning as a trigger in accordance with one embodiment of the present invention, illustrating detailed structures of lateral field effect rectifiers $FER_1/FER_2$ in FIG. 2. As shown in FIG. 6, likewise, the lateral field effect rectifiers $FER_1/FER_2$ are set on the GaN substrate 100. An AlGaN layer 102 is formed on the GaN substrate 100 so as to form a 2DEG as conductive channel. A p-GaN layer 104 is further formed on the AlGaN layer 102 to deplete the 2DEG right thereunder in order to form non-conductive depletion region. Furthermore, the lateral field effect rectifiers $FER_1/FER_2$ further includes a first anode $D_{A1}$ formed on the p-GaN layer 104, and a second anode $D_{A2}$ and a cathode $D_C$ formed on the GaN substrate 100 and AlGaN layer 102 respectively at two sides of the p-GaN layer 104. Specifically, the first anode $D_{A1}$ and second anode $D_{A2}$ are coupled with each other to fulfill the rectifying function like forward conducting and reverse blocking of the diode device with properties like low on-state resistance and high reverse withstand. In the embodiment, the width of first anode $D_{A1}$ (in the direction perpendicular to page) is preferably between 50 μm-1000 μm. Likewise, the material of first anode $D_{A1}$, second anode $D_{A2}$ and cathode $D_C$ may include refractory metal or conductive layer of relevant compound, like Ti, TiN, TiW and W, or may include Ni, Au, Cu or the alloy thereof. In the embodiment of present invention, take the first lateral field effect rectifier $FER_1$ as an example, when positive voltage surge enters the chip from I/O terminal, cathode $D_C$ is equivalent to the another terminal that is coupled with the I/O terminal, while the first anode $D_{A1}$ and second anode $D_{A2}$ are equivalent to the another terminal that is coupled with the first reference voltage $V_{R1}$. The second lateral field effect rectifier FER$_2$ is in inverted configuration in the condition of negative voltage surge.

Figure 7:
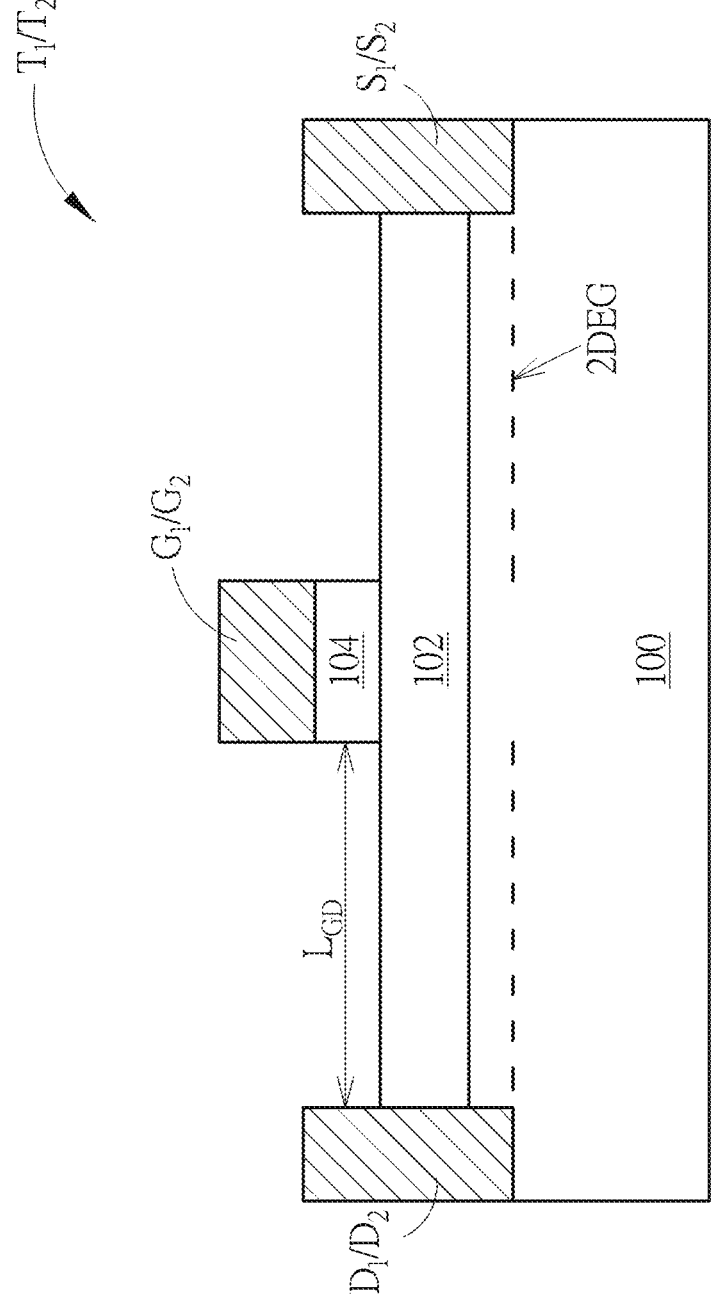
FIG. 7 is a schematic cross-section of a LV-HEMT in accordance with one embodiment of the present invention.

Please refer now to FIG. 7, which is a schematic cross-section of a LV-HEMT in accordance with one embodiment of the present invention, illustrating detailed structures of first LV-HEMT T$_1$/second LV-HEMT T$_2$ in FIG. 1. As shown in FIG. 7, likewise, the first LV-HEMT T$_1$/second LV-HEMT T$_2$ in the present invention are set on GaN substrate 100. An AlGaN layer 102 is formed on the GaN substrate 100 so as to form a 2DEG as conductive channel. A pattern of p-GaN layer 104 is further formed on the AlGaN layer 102 to deplete the 2DEG right thereunder in order to form non-conductive depletion region as the channel of transistor. Furthermore, the LV-HEMT T$_1$/T$_2$ further includes a gate G$_1$/G$_2$ formed on the p-GaN layer 104, and a source S$_1$/S$_2$ and a drain D$_1$/D$_2$ formed on the GaN substrate 100 and AlGaN layer 102 respectively at two sides of the p-GaN layer 104. In the embodiment, the width of gate G$_1$/G$_2$ (in the direction perpendicular to page) is preferably greater than 1000 μm. In addition, the gate-to-drain length $L_{GD}$ Of HEMT may have different dimension correspondingly for different operating voltages. For example, with respect to high-voltage (HV) device, the length $L_{GD}$ is preferably between 15 μm-20 μm. With respect to moderate voltage device, the length $L_{GD}$ is preferably between 1.8 μm-5 μm. With respect to low-voltage (LV) device, the length $L_{GD}$ is preferably between 1 μm-1.8 μm. Likewise, the material of gate G$_1$/G$_2$, source S$_1$/S$_2$ and drain D$_1$/D$_2$ may include refractory metal or conductive layer of relevant compound, like Ti, TiN, TiW and W, or may include Ni, Au, Cu or the alloy thereof. In the embodiment of present invention, take the second LV-HEMT T$_2$ as an example, when positive voltage surge enters the chip from I/O terminal, the second gate G$_2$ is asserted upward to an active level and conducted, then when the first LV-HEMT T$_1$ coupling with the second drain D$_2$ is also turned on, the second conductive path from the I/O terminal to first reference voltage $V_{R1}$ through the first LV-HEMT T$_1$ and second LV-HEMT T$_2$ is therefore established to release ESD surge.

According to the aforementioned embodiments, it may be understood that one major feature of the present invention is that all components in the ESD protection circuit may be GaN-based devices and/or may be compatible with the process of GaN-based devices, including resistors, capacitors, lateral field effect rectifiers or HEMTs. These devices may be manufactured on the same GaN substrate and integrally formed in the same process. For example, the main resistor R and first/second 2DEG resistors R$_1$/R$_2$, the first/second triggers C$_1$/C$_2$ or FER$_1$/FER$_2$, and the power HEMT T and first/second LV-HEMTs T$_1$/T$_2$ may share the same GaN substrate 100 and the same AlGaN layer 102. Furthermore, the first/second triggers C$_1$/C$_2$ or FER$_1$/FER$_2$, and the power HEMT T and first/second LV-HEMTs T$_1$/T$_2$ may further share the same p-GaN layer 104. This scheme is beneficial for the circuit design and process integration of power HEMT device, reducing necessary cost and steps, which is the advantage of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge protection circuit using gallium nitride devices, comprising:

a power high electron mobility transistor with a gate, a source and a drain, said source and said drain are coupled respectively to a first reference voltage and a second reference voltage; and an electrostatic discharge protection block, comprising:
    a first sub-block, comprising:
        a first two-dimensional electron gas resistor with one terminal coupled to said first reference voltage;
        a first trigger with one terminal coupled to another terminal of said first two-dimensional electron gas resistor and with another terminal coupled to said gate, wherein said first trigger comprises at least one lateral field effect rectifier in serial connection, and each said lateral field effect rectifier comprises:
            a gallium nitride substrate;
            an aluminum gallium nitride layer on said gallium nitride substrate;
            a p-type gallium nitride layer on said aluminum gallium nitride layer and coupled with a first anode; and
            a first cathode and a second anode on said gallium nitride substrate and said aluminum gallium nitride layer respectively at two sides of said p-type gallium nitride layer, wherein said first anode is coupled to said second anode; and
        a first low-voltage high electron mobility transistor with a first gate, a first source and a first drain, said first gate is coupled to said another terminal of said first two-dimensional electron gas resistor and said terminal of said first trigger, and said first drain is coupled to said gate; and
    a second sub-block, comprising:
        a second two-dimensional electron gas resistor with one terminal coupled to said gate;
        a second trigger with one terminal coupled to another terminal of said second two-dimensional electron gas resistor and with another terminal coupled to said first reference voltage; and
        a second low-voltage high electron mobility transistor with a second gate, a second source and a second drain, said second gate is coupled to said terminal of said second trigger and said another terminal of said second two-dimensional electron gas resistor, and said second drain is coupled to said first source of said first low-voltage high electron mobility transistor, and said second source is coupled to said first reference voltage.

2. The electrostatic discharge protection circuit using gallium nitride devices of claim 1, wherein said second trigger is a gallium nitride capacitor, comprising:
    said gallium nitride substrate;
    said aluminum gallium nitride layer on said gallium nitride substrate;
    said p-type gallium nitride layer on said aluminum gallium nitride layer and coupled with an third anode; and
    a second cathode on said gallium nitride substrate and said aluminum gallium nitride layer at one side of said p-type gallium nitride layer.

3. The electrostatic discharge protection circuit using gallium nitride devices of claim 1, wherein said second trigger is a metal-insulator-metal capacitor, comprising:
    said gallium nitride substrate;
    an ion implant isolation layer on said gallium nitride substrate;
    a passivation layer on said ion implant isolation layer;
    an anode metal layer in said passivation layer; and
    a cathode metal layer on said passivation layer.

4. The electrostatic discharge protection circuit using gallium nitride devices of claim 1, wherein said second trigger comprises at least one lateral field effect rectifier in serial connection, and each said lateral field effect rectifier comprises:

said gallium nitride substrate;

said aluminum gallium nitride layer on said gallium nitride substrate;

said p-type gallium nitride layer on said aluminum gallium nitride layer and coupled with a third anode; and a second cathode and a fourth anode on said gallium nitride substrate and said aluminum gallium nitride layer respectively at two sides of said p-type gallium nitride layer, wherein said third anode is coupled to said fourth anode.

5. The electrostatic discharge protection circuit using gallium nitride devices of claim 1, further comprising a main two-dimensional electron gas resistor with one terminal coupled to said gate and with another terminal coupled to said terminal of said second two-dimensional electron gas resistor, said another terminal of said first trigger and said first drain.

6. The electrostatic discharge protection circuit using gallium nitride devices of claim 5, wherein said main two-dimensional electron gas resistor comprises:

said gallium nitride substrate;

said aluminum gallium nitride layer on said gallium nitride substrate; and a high-voltage terminal and a low-voltage terminal on said gallium nitride substrate and said aluminum gallium nitride layer.

7. The electrostatic discharge protection circuit using gallium nitride devices of claim 1, wherein said first two-dimensional electron gas resistor comprises:

said gallium nitride substrate;

said aluminum gallium nitride layer on said gallium nitride substrate; and a high-voltage terminal and a low-voltage terminal on said gallium nitride substrate and said aluminum gallium nitride layer.

8. The electrostatic discharge protection circuit using gallium nitride devices of claim 1, wherein said second two-dimensional electron gas resistor comprises:

said gallium nitride substrate;

said aluminum gallium nitride layer on said gallium nitride substrate; and a high-voltage terminal and a low-voltage terminal on said gallium nitride substrate and said aluminum gallium nitride layer.

9. The electrostatic discharge protection circuit using gallium nitride devices of claim 1, wherein said first low-voltage high electron mobility transistor comprises:

said gallium nitride substrate;

said aluminum gallium nitride layer on said gallium nitride substrate;

said p-type gallium nitride layer on said aluminum gallium nitride layer and coupled with said first gate; and said first source and said first drain on said gallium nitride substrate and said aluminum gallium nitride layer respectively at two sides of said p-type gallium nitride layer.

10. The electrostatic discharge protection circuit using gallium nitride devices of claim 1, wherein said second low-voltage high electron mobility transistor comprises:

said gallium nitride substrate;

said aluminum gallium nitride layer on said gallium nitride substrate;

said p-type gallium nitride layer on said aluminum gallium nitride layer and coupled with said second gate; and said second source and said second drain on said gallium nitride substrate and said aluminum gallium nitride layer respectively at two sides of said p-type gallium nitride layer.

11. The electrostatic discharge protection circuit using gallium nitride devices of claim 1, wherein said first two-dimensional electron gas resistor, said first trigger, said first low-voltage high electron mobility transistor, said second two-dimensional electron gas resistor, said second trigger and said second low-voltage high electron mobility transistor share the same said gallium nitride substrate and the same said aluminum gallium nitride layer.

12. The electrostatic discharge protection circuit using gallium nitride devices of claim 1, wherein said first trigger, said second trigger, said first low-voltage high electron mobility transistor and said second low-voltage high electron mobility transistor share the same said p-type gallium nitride layer.

13. The electrostatic discharge protection circuit using gallium nitride devices of claim 1, wherein said first trigger has a threshold voltage, and when a voltage of said another terminal of said first trigger is greater than a voltage of said terminal of said first trigger and a voltage difference therebetween exceeds said threshold voltage of said first trigger, said first trigger conducts; and said second low-voltage high electron mobility transistor has a threshold voltage, and when a voltage of said second gate of said second low-voltage high electron mobility transistor is greater than a voltage of said second source and a voltage of said second drain and when a voltage difference therebetween exceeds said threshold voltage of said second low-voltage high electron mobility transistor, said second low-voltage high electron mobility transistor conducts, and said threshold voltage of said first trigger is greater than said threshold voltage of said second low-voltage high electron mobility transistor.

14. The electrostatic discharge protection circuit using gallium nitride devices of claim 1, wherein said second trigger has a threshold voltage, and when a voltage of said another terminal of said second trigger is greater than a voltage of said terminal of said second trigger and a voltage difference therebetween exceeds said threshold voltage of said second trigger, said second trigger conducts; and said first low-voltage high electron mobility transistor has a threshold voltage, and when a voltage of said first gate of said first low-voltage high electron mobility transistor is greater than a voltage of said first source and a voltage of said first drain and when a voltage difference therebetween exceeds said threshold voltage of said first low-voltage high electron mobility transistor, said first low-voltage high electron mobility transistor conducts, and said threshold voltage of said second trigger is greater than said threshold voltage of said first low-voltage high electron mobility transistor.

\* \* \* \* \*